US010249608B1

(12) United States Patent
Chaudhry

(10) Patent No.: US 10,249,608 B1
(45) Date of Patent: Apr. 2, 2019

(54) ESD PROTECTION CIRCUIT

(71) Applicant: Qorvo US, Inc., Greensboro, NC (US)

(72) Inventor: Iqbal Chaudhry, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/851,917

(22) Filed: Dec. 22, 2017

Related U.S. Application Data

(60) Provisional application No. 62/555,769, filed on Sep. 8, 2017.

(51) Int. Cl.
*H01L 27/02* (2006.01)
*H01L 29/737* (2006.01)
*H03K 3/021* (2006.01)
*H02H 9/04* (2006.01)

(52) U.S. Cl.
CPC ........ *H01L 27/0259* (2013.01); *H01L 29/737* (2013.01); *H02H 9/046* (2013.01); *H03K 3/021* (2013.01)

(58) Field of Classification Search
CPC ........... H02H 9/04; H02H 9/041; H02H 9/046
USPC .................................................. 361/56, 111
See application file for complete search history.

(56) References Cited

U.S. PATENT DOCUMENTS

2016/0352098 A1* 12/2016 Chaudhry ............... H02H 9/046
2018/0190639 A1* 7/2018 Hill ....................... H01L 27/027

OTHER PUBLICATIONS

Cui, Q., et al., "Development of a New pHEMT-Based Electrostatic Discharge Protection Structure," IEEE Transactions on Electron Devices, vol. 58, No. 9, Sep. 2011, 7 pages.

Cui, Q., et al., "A Novel Electrostatic Discharge (ESD) Protection Circuit in D-Mode pHEMT Technology," 2012 IEEE Compound Semiconductor Integrated Circuit Symposium (CSICS), La Jolla, California, USA, Oct. 14-17, 2012, 4 pages.

Cui, Q., et al., "Novel Drain-Less Multi-Gate pHEMT for Electrostatic Discharge (ESD) Protection in GaAs Technology," 2013 IEEE International Reliability Physics Symposium (IRPS), Anaheim, California, USA, Apr. 14-18, 2013, 4 pages.

Liou, J. J., et al., "Novel Electrostatic Discharge (ESD) Protection Solution in GaAs pHEMT Technology," 2012 19th IEEE International Symposium on the Physical and Failure Analysis of Integrated Circuits (IPFA), Singapore, Jul. 2-6, 2012, 4 pages.

(Continued)

*Primary Examiner* — Dharti H Patel
(74) *Attorney, Agent, or Firm* — Withrow & Terranova, P.L.L.C.

(57) ABSTRACT

An electrostatic protection circuit is disclosed. The electrostatic protection circuit includes delay circuitry coupled between a supply voltage node and a fixed voltage node. The electrostatic protection circuit also includes latch circuitry made up of current-limiting circuitry that includes a gallium arsenide transistor and a latch. The current-limiting circuitry and the latch are coupled between the supply voltage node and the fixed voltage node, and the current-limiting circuitry is also coupled to the delay circuitry. The electrostatic protection circuit further includes discharge circuitry coupled between the supply voltage node and the fixed voltage node and to the latch, wherein the latch is configured to drive the discharge circuitry to short the supply voltage node to the fixed voltage node during an electrostatic discharge event, and the current-limiting circuitry is configured to limit latch current from the supply voltage node to the latch during normal operation.

19 Claims, 4 Drawing Sheets

(56) References Cited

OTHER PUBLICATIONS

Muthukrishnan, S., et al., "A Novel Clamp Based ESD Protection Structure for High Power RF Ports in GaAs pHEMT Process," 2011 IEEE Compound Semiconductor Integrated Circuit Symposium (CSICS), Waikoloa, Hawaii, Oct. 16-19, 2011, 4 pages.

* cited by examiner

ESD PROTECTION CIRCUIT

PRIORITY APPLICATION

This application claims the benefit of provisional patent application Ser. No. 62/555,769, filed Sep. 8, 2017, the disclosure of which is hereby incorporated herein by reference in its entirety.

FIELD OF THE DISCLOSURE

The present disclosure is generally related to protecting integrated circuits from electrostatic discharge.

BACKGROUND

Mobile communication devices have become increasingly common in the present society. The prevalence of these communication devices follows in part from the numerous functions that are enabled on such devices. Demand for such functions increases the processing capability requirements for the mobile communication devices. As a result, increasingly complex integrated circuits are being designed and manufactured to provide ever greater functionality in the mobile communication devices.

To meet this ever greater demand for functionality in communications devices, engineers have turned to gallium arsenide bipolar high electron mobility (GaAs BiHEMT) technology. As such, there is a growing need to protect GaAs BiHEMT-based integrated circuits from electrostatic discharge (ESD). Electrostatic discharge can be thought of as a miniature lightning bolt of static electricity between two semiconductor layers of different electrical potentials. Without proper protection, ESD may generate an electrical current high enough to damage or destroy passive and active devices that make up communication devices. However, a challenge remains in realizing latch circuitry having low-leakage current needed to protect from ESD the GaAs BiHEMT integrated circuits making up communication devices, wherein the latch circuitry has nanoampere level low-leakage current. This challenge is largely due to the fact that GaAs BiHEMT technology includes enhancement-mode and depletion-mode devices. What is needed is electrostatic protection circuitry that provides latch circuitry needed to protect GaAs BiHEMT integrated circuits while having nanoampere level low leakage.

SUMMARY

An electrostatic protection circuit is disclosed. The electrostatic protection circuit includes delay circuitry coupled between a supply voltage node and a fixed voltage node. The electrostatic protection circuit also includes latch circuitry made up of current-limiting circuitry that includes a gallium arsenide transistor and a latch. The current-limiting circuitry and the latch are coupled between the supply voltage node and the fixed voltage node, and the current-limiting circuitry is also coupled to the delay circuitry. The electrostatic protection circuit further includes discharge circuitry coupled between the supply voltage node and the fixed voltage node and to the latch, wherein the latch is configured to drive the discharge circuitry to short the supply voltage node to the fixed voltage node during an electrostatic discharge event, and the current-limiting circuitry is configured to limit latch current from the supply voltage node to the latch during normal operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
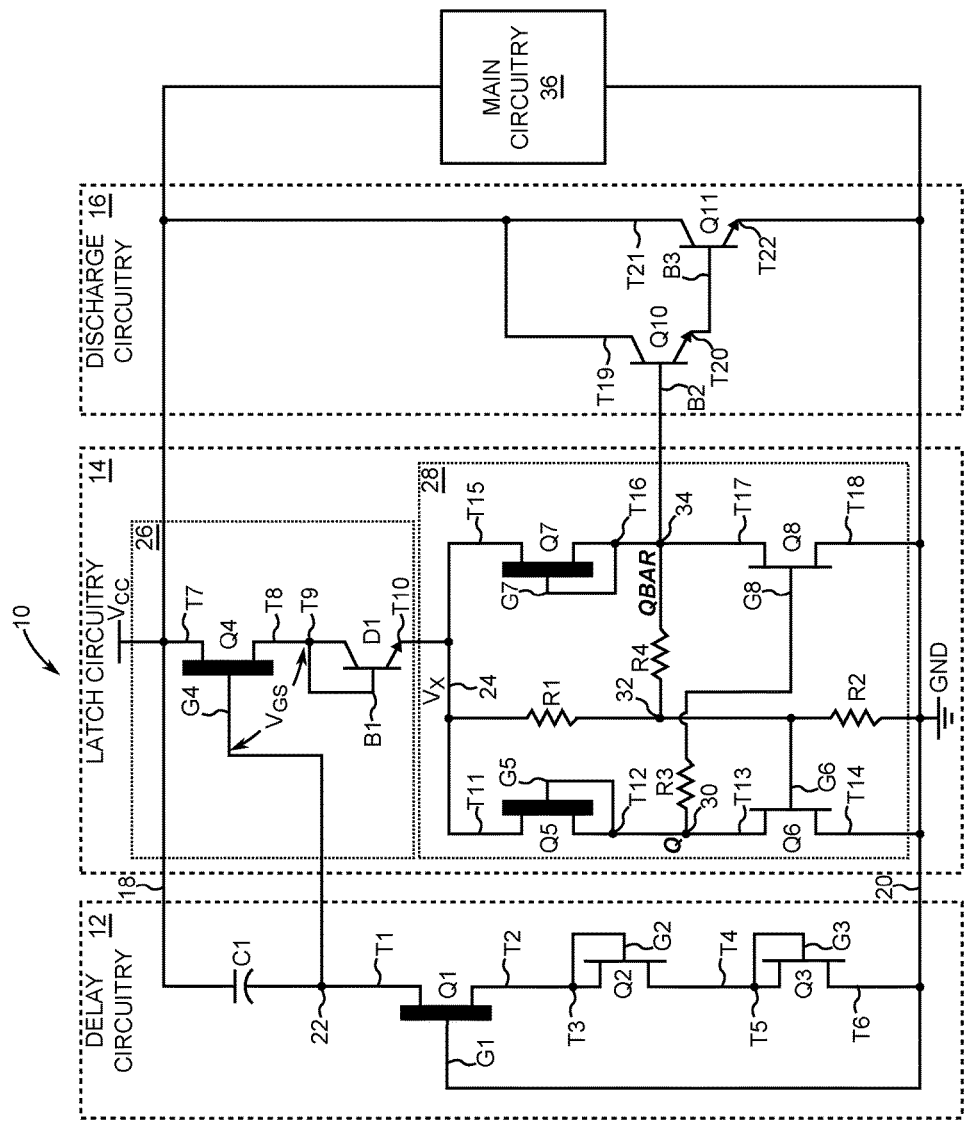
FIG. 1 is a schematic of a first embodiment of electrostatic discharge (ESD) circuitry that is configured as an ESD power supply clamp for gallium arsenide bipolar high electron mobility transistor (GaAs BiHEMT) integrated circuits.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a first embodiment of electrostatic discharge (ESD) protection circuitry 10 that is configured as an ESD power supply clamp for gallium arsenide bipolar high electron mobility transistor (GaAs BiHEMT) integrated circuits. The ESD protection circuitry 10 includes delay circuitry 12, latch circuitry 14, and discharge circuitry 16. The delay circuitry 12 is made up of a capacitor C1, a first depletion-mode (D-mode) transistor Q1, a first enhancement-mode (E-mode) transistor Q2, and a second E-mode transistor Q3 that are coupled in series between a supply voltage node 18 and a fixed voltage node 20 that is typically ground. The first E-mode resistor Q2 and the second E-mode transistor Q3 are both configured to function as pinch-off diodes that ensure that the first D-mode transistor Q1 functions as a mega-ohm resistor. Using a standard passive resistor in place of the first D-mode transistor Q1 would be impractical from an integrated real estate requirement. The first D-mode transistor Q1, the first E-mode transistor Q2, and the second E-mode transistor Q3 take up at most 1% of the area consumed by a standard passive resistor of equal resistance value. During operation, a supply voltage $V_{CC}$ is applied to the supply voltage node 18.

The capacitor C1 is coupled between the supply voltage node 18 and a timer voltage node 22. A first current terminal T1 of the first D-mode transistor Q1 is coupled to the timer voltage node 22, and a first gate terminal G1 of the first D-mode transistor Q1 is coupled to the fixed voltage node 20, which in this exemplary embodiment is ground GND. A second current terminal T2 of the first D-mode transistor Q1 is coupled to both a second gate terminal G2 and a third current terminal T3 of the first E-mode transistor Q2. In turn, a fourth current terminal T4 of the first E-mode transistor Q2 is coupled to both a third gate terminal G3 and a fifth current terminal T5 of the second E-mode transistor Q3. A sixth current terminal T6 of the second E-mode transistor Q3 is coupled to the fixed voltage node 20, which in this exemplary embodiment is ground GND.

The latch circuitry 14 includes current-limiting circuitry 26 made up of a second D-mode transistor Q4 that has a seventh current terminal T7 that is coupled to the supply voltage node 18 and a fourth gate terminal G4 coupled to the timer voltage node 22 of the delay circuitry 12. The current-limiting circuitry 26 further includes a pinch-off diode D1 coupled between an eighth current terminal T8 of the second D-mode transistor Q4 and a latch supply node 24. In this exemplary embodiment, the pinch-off diode D1 is realized with a diode-configured bipolar transistor. As such, the pinch-off diode D1 has a first base terminal B1 and a ninth current terminal T9 coupled to the eighth current terminal T8 of the second D-mode transistor Q4. A tenth current terminal T10 of the pinch-off diode D1 is coupled to the latch supply node 24. In this exemplary case, the ninth current terminal T9 is a collector terminal and the tenth current terminal T10 is an emitter terminal.

The latch circuitry 14 further includes a latch 28 that is coupled between the latch supply node 24 and the fixed voltage node 20. The latch 28 includes a third D-mode transistor Q5 and a third E-mode transistor Q6 that are coupled in series between the latch supply node 24 and the fixed voltage node 20. The third D-mode transistor Q5 has an eleventh current terminal T11 coupled to the latch supply node 24 and a fifth gate G5 coupled to a twelfth current terminal T12, which in turn is coupled to a first output node 30. The third E-mode transistor Q6 has a thirteenth current terminal T13 coupled to the first output node 30, a fourteenth current terminal T14 coupled to the fixed voltage node 20, and a sixth gate G6 that is coupled to a trigger node 32. The trigger node 32 is located between a first resistor R1 and a second resistor R2 that are coupled in series between the latch supply node 24 and the fixed voltage node 20. A resistance ratio between the first resistor R1 and the second resistor R2 sets a trigger voltage threshold that transitions the state of the latch circuitry 14 between a normal operation state and an ESD protection state. Exemplary trigger voltage thresholds may be 7 V for a nominal 5 V supply voltage and 4.5 V for a nominal 3 V system.

The latch 28 includes a fourth D-mode transistor Q7 and a fourth E-mode transistor Q8 that are coupled in series between the supply voltage node 18 and the fixed voltage node 20. The fourth D-mode transistor Q7 has a fifteenth current terminal T15 coupled to the latch supply node 24, and a seventh gate G7 coupled to a sixteenth current terminal T16, which in turn is coupled to a second output node 34. The fourth E-mode transistor Q8 has a seventeenth current terminal T17 coupled to the second output node 34, an eighteenth current terminal T18 coupled to the fixed voltage node 20, and an eighth gate G8 that is coupled to the first output node 30 through a third resistor R3. A fourth resistor R4 is coupled between the trigger node 32 and the second output node 34.

The discharge circuitry 16 receives output from the latch circuitry 14 by way of the second output node 34. In particular, the discharge circuitry 16 includes a driver transistor Q10 having a second base terminal B2 coupled to the second output node 34, a nineteenth current terminal T19 coupled to the supply voltage node 18, and a twentieth current terminal T20 that drives a discharge transistor Q11. The discharge transistor Q11 has a twenty-first current terminal T21 that is coupled to the supply voltage node 18 and a twenty-second current terminal T22 that is coupled to the fixed voltage node 20, which in this exemplary case is ground GND. A third base terminal B3 couples to the twentieth current terminal T20 such that the driver transistor Q10 and the discharge transistor Q11 are coupled in a Darlington configuration. In exemplary embodiments, the driver transistor Q10 and the discharge transistor Q11 are both gallium arsenide of the heterojunction bipolar transistor type. Moreover, the D-mode transistors Q1, Q4, Q5 and Q7 and the E-mode transistors Q2, Q3, Q6, and Q8 are field-effect transistors of the pseudomorphic HEMT type.

In general, the delay circuitry 12 controls the latch circuitry 14 that drives the discharge circuitry 16 to discharge electrostatic charge from the supply voltage node 18 in order to protect main circuitry 36 from ESD events. An example of main circuitry 36 is a radio frequency power amplifier for a mobile telephone.

During power-up the supply voltage $V_{CC}$ is applied to the supply voltage node 18 and increases to a steady state level within a few microseconds. Simultaneously, the capacitor C1 charges at a rate that maintains a gate-to-source voltage $V_{GS}$ of the second D-mode transistor Q4 above its pinch-off voltage. As a result, the second D-mode transistor Q4 is in an ON state during power-up that allows electrical current to flow between the seventh current terminal T7 and the eighth current terminal T8, which in turn allows a latch feed voltage $V_X$ at the latch supply node 24 to follow the supply voltage $V_{CC}$. The supply voltage $V_{CC}$ and the latch feed voltage $V_X$ are both measured relative to the fixed voltage node 20.

Also during power-up, the third D-mode transistor Q5 pulls up a gate voltage applied to the gate terminal G8 of the fourth E-mode transistor Q8. Once this gate voltage is pulled up to a steady state level, the fourth E-mode transistor Q8 is in an ON state that allows current to flow between the seventeenth current terminal T17 and the eighteenth current terminal T18. As a result, current is pulled from the second base terminal B2 of the driver transistor Q10, which in turn ensures that the discharge transistor Q11 is in an OFF state that does not allow current to flow between the twenty-first current terminal T21 and the twenty-second current terminal T22. From a logic point of view, a logic state Q at the first output node 30 is high and a logic state QBAR at the second output node 34 is low during normal operation with no ESD event occurring. As the capacitor C1 is charging towards the supply voltage $V_{CC}$, voltage at the timer voltage node 22 is dropping towards the voltage level of the fixed voltage node 20, which is at a zero volt ground potential. The pinch-off diode D1 ensures that the second D-mode transistor Q4 is practically in an OFF state since the voltage at the timer voltage node 22 and the fourth gate terminal G4 is near zero. As such, during the normal operation state, latch current flowing from the supply voltage node 18 into the latch 28 is limited. In at least one embodiment, the latch current is limited to less than 25 nanoamperes (nA) during normal operation. In at least one other embodiment, the latch current is limited to less than 50 nA during normal operation. In at least one further embodiment, the latch current is limited to less than 100 nA. In yet at least one other embodiment, the latch current is limited to less than 1000 nA. At this point, the ESD protection circuitry 10 is ready to protect the main circuitry 36 from an ESD event.

An ESD event may occur when a charged human body touches sensitive electronic equipment such as a mobile telephone in which the ESD protection circuitry 10 is employed. During an ESD event in which a discharge of several thousand volts may occur, the supply voltage $V_{CC}$ may spike toward several hundred volts. As supply voltage $V_{CC}$ rises with the spike, a voltage at the trigger node 32 rises in unison past the trigger voltage threshold set by the resistance ratio of the first resistor R1 and the second resistor R2. In response to the voltage at the trigger voltage rising past the trigger voltage threshold, the third E-mode transistor Q6 transitions to an ON state that changes the logic state Q from high to low as voltage at the first output node 30 drops to the voltage of the fixed voltage node 20, which in this example is at ground potential. Practically simultaneously, the fourth E-mode transistor Q8 transitions to an OFF state that changes the logic state QBAR from low to high as voltage at the second output node 34 rises to a level that turns on the discharge circuitry 16 by forcing current into the second base terminal B2 of the driver transistor Q10. In response, the driver transistor Q10 drives saturation current into the discharge transistor Q11, which transitions to an ON state that effectively shorts the supply voltage node 18 to the fixed voltage node 20, thereby discharging charge from the ESD event and the capacitor C1. As such, voltage applied to the supply voltage node 18 is clamped to a level below the trigger voltage threshold set by the resistance ratio of the first resistor R1 and the second resistor R2, thereby protecting the main circuitry 36 and the ESD protection circuitry 10 from permanent damage.

Due to a time constant set by the capacitance of the capacitor C1 and total series resistance of the first D-mode transistor Q1, the first E-mode transistor Q2, and the second E-mode transistor Q3 of the delay circuitry 12, voltage across the capacitor C1 drops to a level that resets the latch 28 to return the discharge circuitry to the OFF state within a predetermined discharge delay of on the order of microseconds. In at least one embodiment, the predetermined discharge delay is between 1 microsecond (µs) and 3 µs. In at least one other embodiment, the predetermined discharge delay is between 2 µs and 4 µs. In still another embodiment, the predetermined discharge delay is between 4 µs and 10 µs.

Immediately following the predetermined discharge delay, the capacitor C1 starts to recharge at a rate that maintains the gate-to-source voltage $V_{GS}$ of the second D-mode transistor Q4 above its pinch-off voltage for a predetermined recovery time. As a result, the second D-mode transistor Q4 is in an ON state during the predetermined recovery time that allows electrical current to flow between the seventh current terminal T7 and the eighth current terminal T8, which in turn allows a latch feed voltage $V_X$ at the latch supply node 24 to follow the supply voltage $V_{CC}$. The predetermined recovery time is generally on the order of a few microseconds and can have the same ranges as the predetermined discharge delay.

Also during the predetermined recovery time, the third D-mode transistor Q5 pulls up the gate voltage applied to the gate terminal G8 of the fourth E-mode transistor Q8. Once this gate voltage is pulled up to a steady state level, the fourth E-mode transistor Q8 is in an ON state that allows current to flow between the seventeenth current terminal T17 and the eighteenth current terminal T18. As a result, current is pulled from the second base terminal B2 of the driver transistor Q10, which in turn ensures that the discharge transistor Q11 is in an OFF state that does not allow current to flow between the twenty-first current terminal T21 and the twenty-second current terminal T22. The logic state Q at the first output node 30 is high and the logic state QBAR at the second output node 34 is low during normal operation after the predetermined recovery time. As the capacitor C1 is charging towards the supply voltage $V_{CC}$, voltage at the timer voltage node 22 is dropping towards the voltage level of the fixed voltage node 20, which is at a zero volt ground potential. The pinch-off diode D1 ensures that the second D-mode transistor Q4 is practically in an OFF state as the voltage at the timer voltage node 22 and the fourth gate terminal G4 is near zero. As such, during the normal operation state, latch current flowing from the supply voltage node 18 into the latch 28 is again limited. At this point, the ESD protection circuitry 10 is ready to protect the main circuitry 36 from another ESD event.

Figure 2:
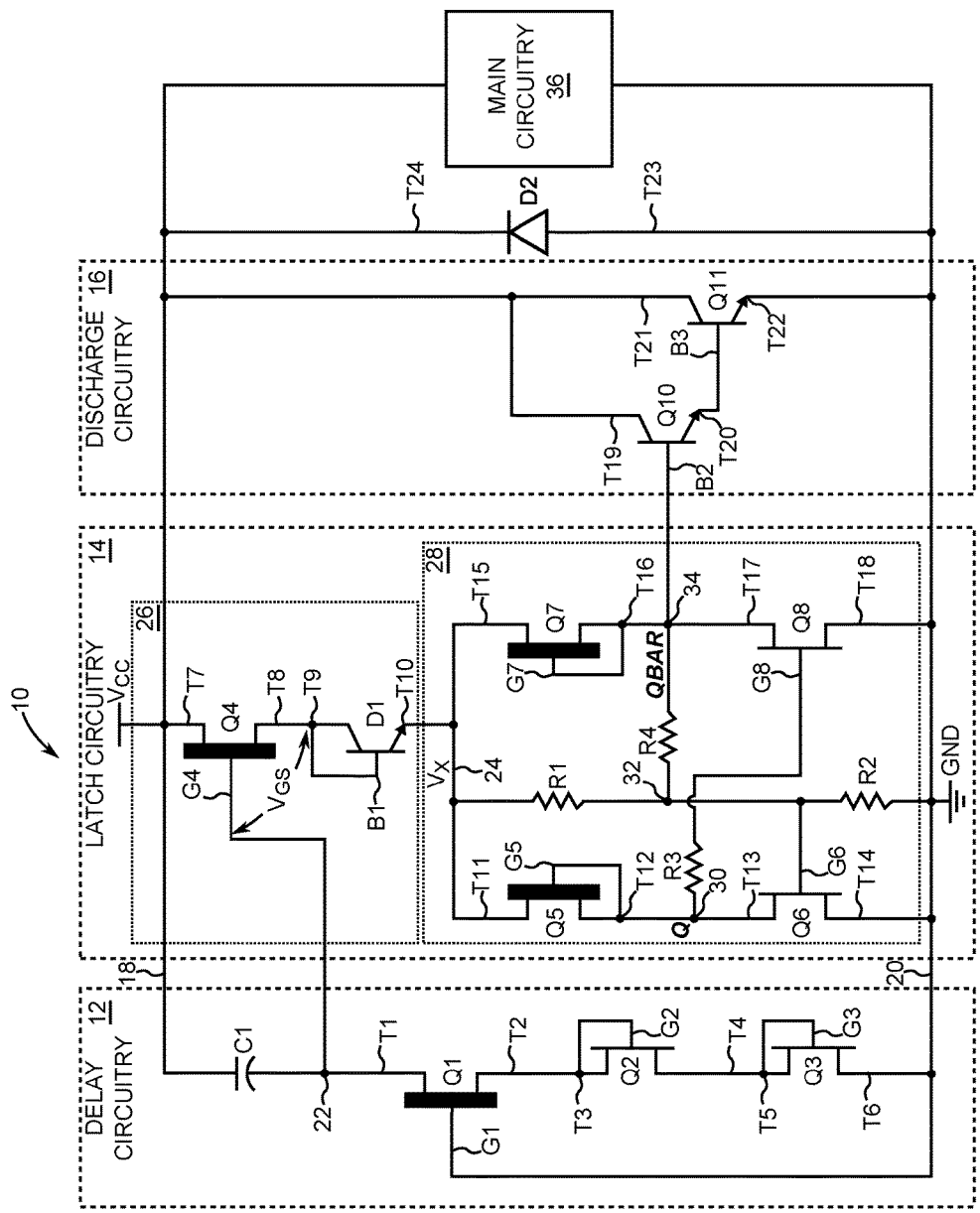
FIG. 2 is a schematic of a second embodiment of ESD circuitry that is configured as an ESD power supply clamp for GaAs BiHEMT integrated circuits.

FIG. 2 is a schematic of a second embodiment of the ESD protection circuitry 10 that is structured identically to the first embodiment with an exception of an addition of a second diode D2 that provides a path for a discharging negative voltage ESD event. In this embodiment, an anode terminal T23 of the second diode D2 is coupled to the fixed voltage node 20 and a cathode terminal T24 is coupled to the supply voltage node 18. The second embodiment of ESD protection circuitry 10 operates exactly as described for the first embodiment of FIG. 1 in response to positive voltage ESD events.

Figure 3:
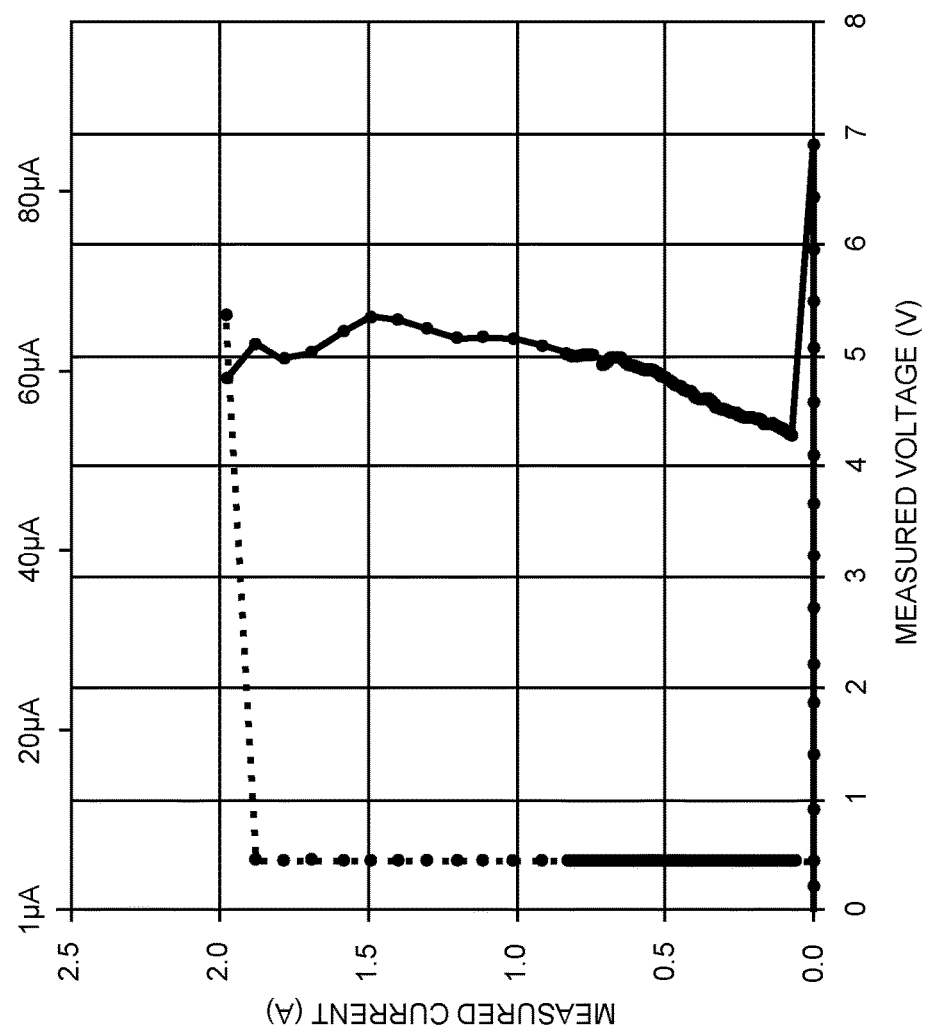
FIG. 3 is a graph of a transmission line pulse current-voltage plot that characterizes voltage snapback performance of the embodiments of the present disclosure.

FIG. 3 is a graph of a transmission line pulse current-voltage plot that characterizes voltage snapback performance of the embodiments of the present disclosure. As illustrated by the graph, the discharge circuitry 16 (FIGS. 1 and 2) remains in the OFF state until measured voltage at the supply voltage node 18 (FIGS. 1 and 2) reaches an exemplary trigger threshold level of 7 V. The measured voltage at the supply voltage node 18 is depicted in solid black line with sample dots. During the predetermined discharge delay with the discharge circuitry 16 in the ON state, the measured voltage at the supply voltage node 18 snaps back to 4.2 V. It should be noted that this snapback voltage of 4.2 V is not due to breakdown of either the driver transistor Q10 or the discharge transistor Q11 but instead is caused by discharge current encountering on-resistance of the driver transistor Q10 and the discharge transistor Q11. A measured human body mode model ESD voltage rating for the ESD protection circuitry 10 is at a minimum of 4,000 V.

Total leakage current for the ESD protection circuitry 10 measured in microamperes (µA) is depicted in dashed line with sample dots. Current scale labeling in microamperes for the total leakage current is provided at the top of the graph of FIG. 3. Notice that the total leakage current remains low until an ESD event occurs. Even then, the total leakage current is only between 60 µA and 80 µA.

Figure 4:
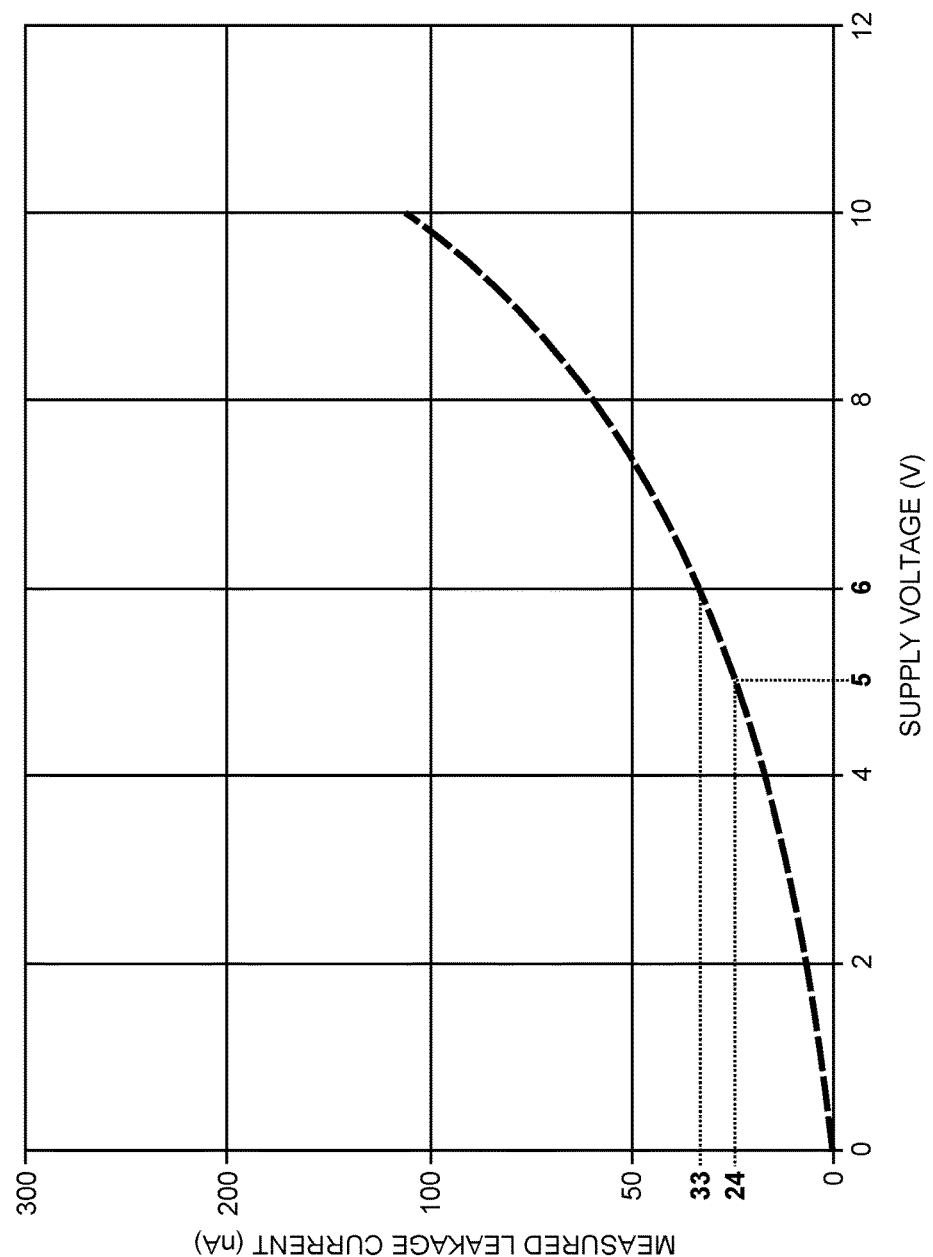
FIG. 4 is a graph of a direct current current-voltage plot that characterizes leakage current for embodiments of the present disclosure.

FIG. 4 is a graph of a direct current current-voltage plot that characterizes leakage current for embodiments of the present disclosure. Notice that leakage current is 24 nA for a supply voltage of 5 V and 33 nA for a supply voltage of 6 V. This low level of leakage current is non-typical for GaAs technology due to lack of insulated gates. Thus, embodiments of the present application are ideally suited to provide ESD protection for battery-powered equipment such as mobile phones.

Those skilled in the art will recognize improvements and modifications to the preferred embodiments of the present disclosure. All such improvements and modifications are considered within the scope of the concepts disclosed herein and the claims that follow.

What is claimed is:

1. An electrostatic discharge protection circuit comprising:
    delay circuitry coupled between a supply voltage node and a fixed voltage node;
    latch circuitry comprising:
        current-limiting circuitry; and
        a latch; wherein
            the current-limiting circuitry and the latch are coupled between the supply voltage node and the fixed voltage node;
            the current-limiting circuitry is coupled to the delay circuitry, and
            the current-limiting circuitry comprises a gallium arsenide transistor and a diode coupled in series with the gallium arsenide transistor and the latch; and
    discharge circuitry coupled between the supply voltage node and the fixed voltage node and to the latch, wherein the latch is configured to drive the discharge circuitry to short the supply voltage node to the fixed voltage node during an electrostatic discharge event, and the current-limiting circuitry is configured to limit latch current from the supply voltage node to the latch during normal operation.

2. The electrostatic discharge protection circuit of claim 1 wherein the current-limiting circuitry is configured to limit latch current to less than 25 nanoamperes during normal operation.

3. The electrostatic discharge protection circuit of claim 1 wherein the current-limiting circuitry is configured to limit latch current to between 25 nanoamperes and 50 nanoamperes during normal operation.

4. The electrostatic discharge protection circuit of claim 1 wherein the current-limiting circuitry is configured to limit latch current to between 50 nanoamperes and 100 nanoamperes.

5. The electrostatic discharge protection circuit of claim 1 wherein the current-limiting circuitry is configured to limit latch current to between 100 nanoamperes and 1000 nanoamperes.

6. The electrostatic discharge protection circuit of claim 1 wherein the delay circuitry comprises a capacitor and a depletion-mode transistor coupled in series between the supply voltage node and the fixed voltage node, wherein the depletion-mode transistor is configured to function as a resistor.

7. The electrostatic discharge protection circuit of claim 6 wherein the depletion-mode transistor is a gallium arsenide transistor.

8. The electrostatic discharge protection circuit of claim 1 wherein the gallium arsenide transistor is a depletion-mode transistor.

9. The electrostatic discharge protection circuit of claim 1 wherein the diode is a bipolar junction transistor configured to function as a pinch-off diode.

10. The electrostatic discharge protection circuit of claim 1 wherein the latch comprises:
    a first depletion-mode transistor coupled in series with a first enhancement-mode transistor at a first output node located between the first depletion-mode transistor and the first enhancement-mode transistor; and
    a second depletion-mode transistor coupled in series with a second enhancement-mode transistor at a second output node located between the second depletion-mode transistor and the second enhancement-mode transistor, wherein a first gate of the first enhancement-mode transistor is coupled to the second output node and a second gate of the second enhancement-mode transistor is coupled to the first output node.

11. The electrostatic discharge protection circuit of claim 10 wherein the first depletion-mode transistor, the first enhancement-mode transistor, the second depletion-mode transistor, and the second enhancement-mode transistor are gallium arsenide transistors.

12. The electrostatic discharge protection circuit of claim 10 wherein the latch further includes a first resistor coupled between the current-limiting circuitry and the first gate of the first enhancement-mode transistor and a second resistor between the coupled between the first gate of the first enhancement-mode transistor and the fixed voltage node.

13. The electrostatic discharge protection circuit of claim 12 wherein a resistance ratio between the first resistor and the second resistor sets a trigger voltage threshold at which logic states of the first output node and the second output node are transitioned.

14. The electrostatic discharge protection circuit of claim 1 wherein the discharge circuitry comprises a driver transistor and a discharge transistor coupled together in a Darlington configuration in which a first current terminal of the discharge transistor is coupled to the supply voltage node and a second current terminal of the discharge transistor is coupled to the fixed voltage node.

15. The electrostatic discharge protection circuit of claim 14 wherein the driver transistor and the discharge transistor are heterojunction bipolar transistors.

16. The electrostatic discharge protection circuit of claim 1 wherein the delay circuitry comprises a capacitor and a first depletion-mode transistor configured to function as a resistor and coupled in series between the supply voltage node and the fixed voltage node with a gate terminal of the gallium arsenide transistor of the current-limiting circuitry being coupled to a timer voltage node located between the capacitor and the first depletion-mode transistor.

17. The electrostatic discharge protection circuit of claim 1 wherein the latch comprises:
 a first depletion-mode transistor coupled in series with a first enhancement-mode transistor at a first output node located between the first depletion-mode transistor and the first enhancement-mode transistor; and
 a second depletion-mode transistor coupled in series with a second enhancement-mode transistor at a second output node located between the second depletion-mode transistor and the second-enhancement mode transistor, wherein a first gate of the first enhancement-mode transistor is coupled to the second output node and a second gate of the second enhancement-mode transistor is coupled to the first output node; and
the discharge circuitry comprises:
 a driver transistor; and
 a discharge transistor coupled together in a Darlington configuration in which a first current terminal of the discharge transistor is coupled to the supply voltage node and a second current terminal of the discharge transistor is coupled to the fixed voltage node, wherein the driver transistor has a base coupled to the second output node.

18. The electrostatic discharge protection circuit of claim 17 wherein the first depletion-mode transistor, the first enhancement-mode transistor, the second depletion-mode transistor, and the second enhancement-mode transistor are gallium arsenide transistors of the pseudomorphic high electron mobility type.

19. The electrostatic discharge protection circuit of claim 17 wherein the driver transistor and the discharge transistor are gallium arsenide heterojunction bipolar transistors.

* * * * *